United States Patent
Kulp

(10) Patent No.: US 8,669,497 B2
(45) Date of Patent: Mar. 11, 2014

(54) APPARATUS AND METHOD FOR PREDICTIVE TEMPERATURE CORRECTION DURING THERMAL PROCESSING

(75) Inventor: John Kulp, Canyon Lake, TX (US)

(73) Assignee: Tokyo Electron Limited, Tokyo (JP)

( * ) Notice: Subject to any disclaimer, the term of this patent is extended or adjusted under 35 U.S.C. 154(b) by 1248 days.

(21) Appl. No.: 11/694,172

(22) Filed: Mar. 30, 2007

(65) Prior Publication Data

US 2008/0241778 A1    Oct. 2, 2008

(51) Int. Cl.
  *H01L 21/67* (2006.01)

(52) U.S. Cl.
  USPC ........... 219/391; 219/400; 219/405; 219/411; 438/17

(58) Field of Classification Search
  USPC ............... 118/660, 712; 219/494, 390, 444.1; 432/5
  See application file for complete search history.

(56) References Cited

U.S. PATENT DOCUMENTS

| | | | |
|---|---|---|---|
| 5,740,016 A * | 4/1998 | Dhindsa | 361/704 |
| 6,203,969 B1 | 3/2001 | Ueda | |
| 6,478,578 B2 * | 11/2002 | Choi et al. | 432/253 |
| 6,919,538 B2 * | 7/2005 | Szekeresch et al. | 219/390 |
| 6,992,270 B2 * | 1/2006 | Lee et al. | 219/444.1 |
| 2004/0059456 A1 * | 3/2004 | Bode et al. | 700/121 |
| 2005/0028836 A1 * | 2/2005 | Adams et al. | 134/1.3 |
| 2005/0072528 A1 * | 4/2005 | Owczarz et al. | 156/345.16 |
| 2005/0254040 A1 * | 11/2005 | Smith et al. | 356/124 |

* cited by examiner

*Primary Examiner* — Brian Jennison
(74) *Attorney, Agent, or Firm* — Wood, Herron & Evans, LLP

(57) ABSTRACT

A thermal processing apparatus and method with predictive temperature correction. Distances are measured from a backside of the wafer relative to a reference plane. Heat is transferred to the backside of the substrate in relation to the measured distances. This allows a baking unit to uniformly heat the substrate to compensate for irregularities or warpage.

26 Claims, 6 Drawing Sheets

APPARATUS AND METHOD FOR PREDICTIVE TEMPERATURE CORRECTION DURING THERMAL PROCESSING

FIELD OF THE INVENTION

The invention relates to an apparatus and methods for thermally processing substrates, such as semiconductor wafers.

BACKGROUND OF THE INVENTION

Coating/developing units, using photolithography processes for manufacturing semiconductor devices and liquid crystal displays (LCD's), generally coat a resist on a substrate, expose the resist coating to light to impart a latent image pattern, and develop the exposed resist coating to transform the latent image pattern into a final image pattern having masked and unmasked areas. This permits deposition or treatment of selected portions of the surface of the semiconductor wafer. Such a series of processing stages is typically carried out in a coating/developing system having discrete heating sections, such as a post apply baking unit and a post exposure baking unit. Each heating section of the coating/developing system incorporates a hotplate with a built-in heater.

Feature sizes of semiconductor device circuits have been scaled to less than 0.1 microns. Typically, the pattern wiring that interconnects individual device circuits is formed with sub-micron line widths. Consequently, the heat treatment temperature of the resist coating should be accurately controlled to provide reproducible and accurate feature sizes and line widths. The substrates or wafers (i.e., objects to be treated) are usually treated or processed under the same process (i.e., individual treatment program) in units (i.e., lots) each consisting of, for example, twenty-five wafers. Individual processes define heat treatment conditions under which baking is performed. Wafers belonging to the same lot are heated under the same conditions.

The post exposure bake (PEB) process serves multiple purposes in photoresist processing. First, the elevated temperature of the bake drives the diffusion of the photoproducts in the resist. A small amount of diffusion may be useful in minimizing the effects of standing waves, which are the periodic variations in exposure dose throughout the depth of the resist coating that result from interference of incident and reflected radiation. Another main purpose of the PEB may be to drive an acid-catalyzed reaction that alters the solubility of the polymer layer used in many chemically amplified resists. PEB may also play a role in removing solvent from the wafer surface.

Hotplates having uniformities within a range of a few tenths of a degree centigrade are currently available and are generally adequate for current process methods. Hotplates are calibrated using a flat bare silicon wafer with imbedded thermal sensors. However, actual production wafers carrying deposited films on the surface of the silicon may exhibit small amounts of warpage because of the stresses induced by the deposited films. This warpage may cause the normal gap between the wafer and the hotplate (referred to as the proximity gap), to vary across the wafer from a normal value of approximately 100 µm by as much as a 100 µm deviation from the mean proximity gap (normal value).

This variability in the proximity gap changes the heat transfer into the wafer causing temperature variations on the wafer surface. These temperature differences in a PEB may result in a change in critical dimension (CD) in that area of several nanometers, which can approach the entire CD variation budget for current leading edge devices, and will exceed the projected CD budget for smaller devices planned for production in the next few years.

What is needed, therefore, is a method for heating a substrate during the pre- and post-exposure bake processes in a thermal processing system that is tolerant of warpage.

SUMMARY OF THE INVENTION

The invention is premised on the realization that in a post exposure bake the topography of the bottom surface of a semiconductor wafer may be measured prior to the post exposure bake process utilizing an inline metrology unit. The topographical data measured by an inline metrology unit may then be conveyed to a control system for a hotplate as the wafer is transferred to the hotplate in a baking unit. Different heating elements in the hotplate are controlled to compensate for the differences in distances from the hotplate surface to the surface of the wafer, as measured in the inline metrology unit.

By imbedding proximity sensors into a surface, above which the wafer is positioned prior to the baking step, one can measure the gap at a plurality of points between each individual wafer and a reference plane on the surface containing the sensors prior to baking. This may provide individual profiles of the warpage for each wafer. From the profile data, individual temperature offsets to compensate for the proximity gap variation may be calculated from a reference look-up table, and the appropriate adjustments may be made to the individual heating element zones beneath the areas of proximity variation. In other embodiments, the topography measurements may be taken after the baking step and stored. The stored measurements are used to adjust the heat applied to the wafer in subsequent baking steps.

Because the ramp up of the temperature of a cold wafer is a dynamic event, small adjustments in control set points may stabilize during the ramp event. By this method, each wafer will see a customized heating event matching the physical shape of that individual wafer. The two primary advantages of this approach are individual wafer physical measurement for custom compensation, and high speed on the fly correction with no loss in production. This same method may be used in other similar wafer heating processes such as the post apply bake.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
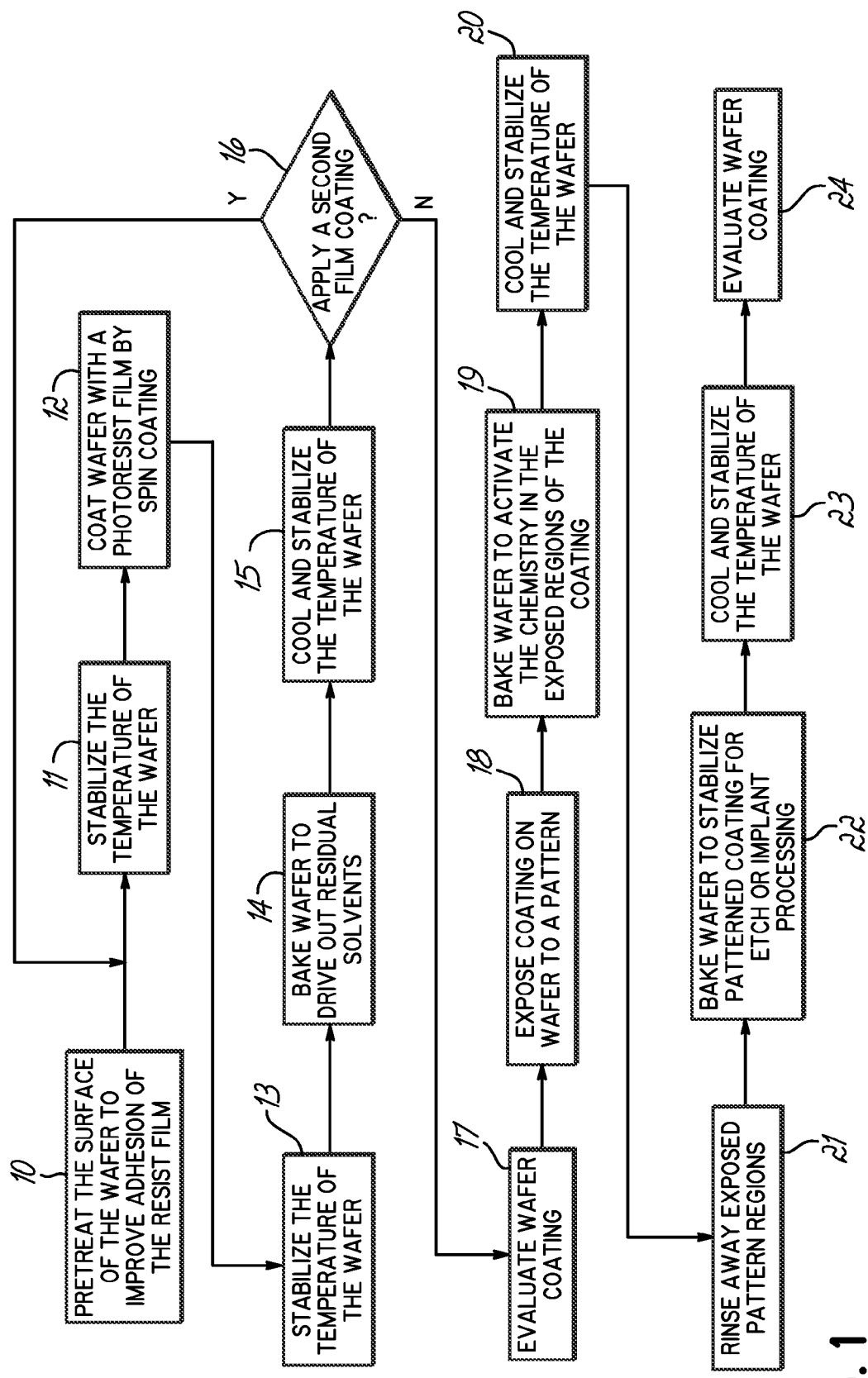
FIG. 1 is a flow diagram depicting an exemplary processing sequence for a semiconducting wafer.

Photolithography processes for manufacturing semiconductor devices are divided into a series of lithography sequences. Each sequence may add a layer on to what may eventually become a multi-layer device. There are many different options that may be contained in any particular sequence. FIG. 1 shows an exemplary lithography sequence that may be used in conjunction with the present invention.

Referring now to FIG. 1, a wafer is loaded on to a coating/developing unit, also known as a Track tool, for processing. In block 10, the wafer may first be transferred to a vapor prime module on the Track tool where the wafer receives a pre-treatment to a surface to improve adhesion of a photoresist coating that will be applied to the wafer. In block 11, the wafer may then be transferred to a cool plate to stabilize the wafer temperature prior to coating. In block 12, once stabilized, the wafer may be transferred to a spin coating device where the wafer is coated by spinning the wafer while dispensing a liquid photoresist or other material to an extremely uniform thin film. In block 13, the wafer may again be transferred to a cool plate to stabilize the temperature of the wafer prior to baking.

In block 14, the wafer may then be baked in a post apply bake step where the wafer is baked to drive out any residual solvents, leaving a photosensitive polymer film. In block 15, after the bake, the wafer may be transfer to a cool plate to cool and stabilize the temperature of the wafer after the bake. In block 16, in some lithography sequences, a second film coating for a top coat or an anti-reflective film coat may be applied. If the second layer is applied, blocks 11-15 are repeated in the sequence shown in FIG. 1.

In block 17, at the completion of the coating process, in some lithography sequences and in accordance with an embodiment of the present invention, the wafer may be evaluated for conformance to parameters. Conventional metrology tools perform their measurements "offline" that is, they are separate units and the production of the wafer must be interrupted for the measurements to be taken, which may introduce delays into the process. For example, a bare wafer thickness measurement may be taken using a metrology unit, preferably in-line with the rest of the process to minimize the wafer being loaded and unloaded from the Track tool. The in-line metrology unit (i.e. IM unit) may provide the thickness measurement to confirm the photoresist film quality, or the IM unit may perform an analysis for patterned wafer defect (macro inspection). In block 18, after the evaluation of the wafer, the wafer may then leave the Track tool and be transferred to a scanner for pattern exposure. After exposure, the wafer may then be transferred back to the Track tool.

In block 19, the wafer may then be transferred to a baking unit for a post exposure bake. This is one of the more critical bake activities, which is sensitive to temperature non-uniformities. The bake activates the chemistry in the exposed regions of the photoresist. In block 20, the wafer may then be transferred after the bake, to a cool plate to cool and stabilize the temperature of the wafer. In block 21, once stabilized, the wafer may then be transferred to a develop unit where the exposed pattern regions are rinsed away, typically with an alkaline fluid, followed by a water rinse. In block 22, the wafer may then be transferred to a bake unit where a post develop bake, or "hard" bake is performed to stabilize the patterned film for resistance to subsequent etching or implant processing.

In block 23, the wafer may be transferred after the hard bake to a cool plate to cool and stabilize the temperature of the wafer. In block 24, after cooling and in some lithography sequences, a metrology unit, in-line or off line, may be used for an After Develop Inspection (ADI) or an Optical Digital Profilometry (ODP) critical dimension measurement. After these measurements, the wafer leaves the Track tool.

Figure 2:
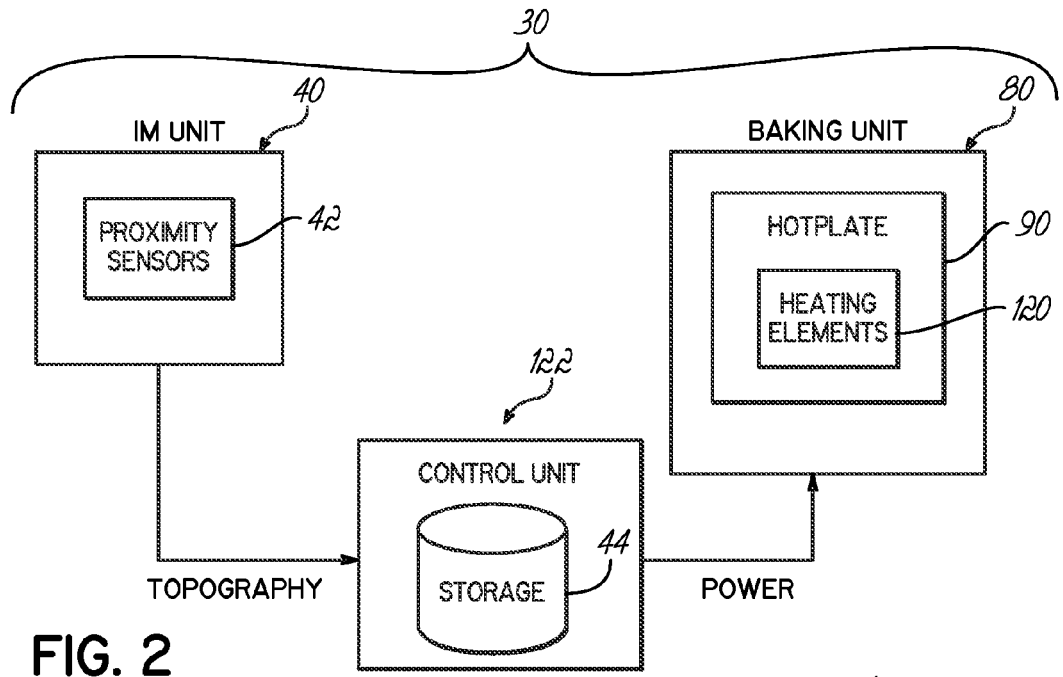
FIG. 2 is a diagrammatic view of a thermal processing apparatus including an inline metrology unit and a baking unit.

Because of the critical nature of the Post Exposure Bake (PEB) step in a lithography sequence, an embodiment of a thermal processing apparatus 30 may be included in the lithography sequence at the first metrology measurement as indicated above. The thermal processing apparatus 30 may include an inline metrology unit 40 (i.e., IM unit) in combination with a baking unit 80 used for the PEB as shown in FIG. 2. The topography measurements from the inline metrology unit 40 transfer to a control unit 122, which may operate baking unit 80.

With reference to FIG. 2 and as discussed above, the wafer 70 is processed in the thermal processing apparatus 30. The wafer 70 is initially transferred to the IM unit 40, as part of the sequence for processing the wafer 70 as discussed above. A series of proximity sensors obtain a plurality of distance measurements in the IM unit 40. These measured distances may then be stored in the control unit 122, or in other embodiments, may be transferred and stored offline. The measured distances may then be used by the control unit 122 to activate and control the heating elements 120 of a hotplate 90 contained in a baking unit 80 as the wafer 70 is being transferred to the baking unit 80. The control unit 122 controls the power supplied to the heating elements 120 to make adjustments to temperatures of the elements based on the measured distances to account for non-uniformities in the wafer 70 and to provide for a uniform heating of the wafer 70.

With reference now to FIGS. 4-7, the inline metrology unit 40 of the thermal processing apparatus 30 may comprise a series of outer walls 62 which house a cylinder 52, common base and support arm 56, a base 60, and a horizontal support wall 63. The base 60 is positioned in a circular cut out in the horizontal support wall 63 and is further supported by a horizontal supporting member 61. An opening 68 in the outer walls 62 allow for the wafer 70 to be transferred to and from the inline metrology unit 40.

Figure 3A:
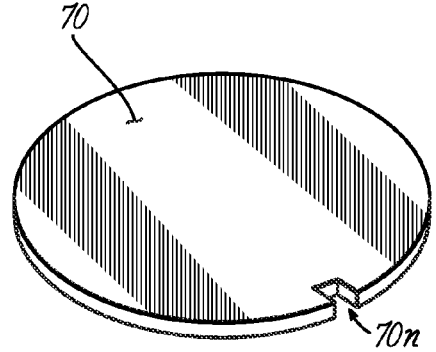
FIG. 3A is an isometric view showing a wafer with an alignment notch.
Figure 3B:
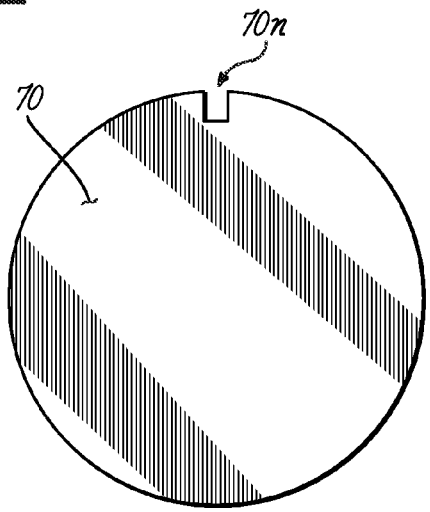
FIG. 3B is a top view of the wafer in FIG. 3A.
Figure 6:
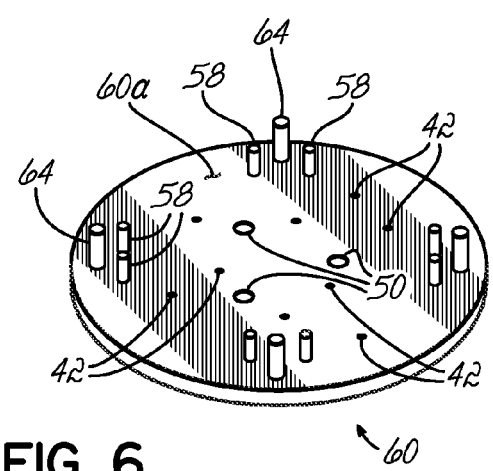
FIG. 6 is an isometric view showing detail of the base of the inline metrology unit of FIGS. 4 and 5.
Figure 7:
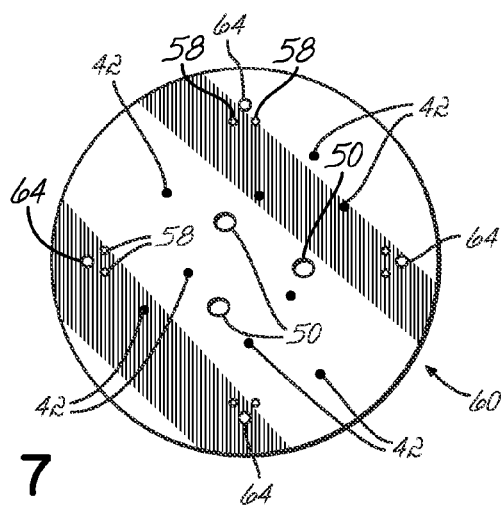
FIG. 7 is a diagrammatic top view of the base of FIG. 6.
Figure 4:
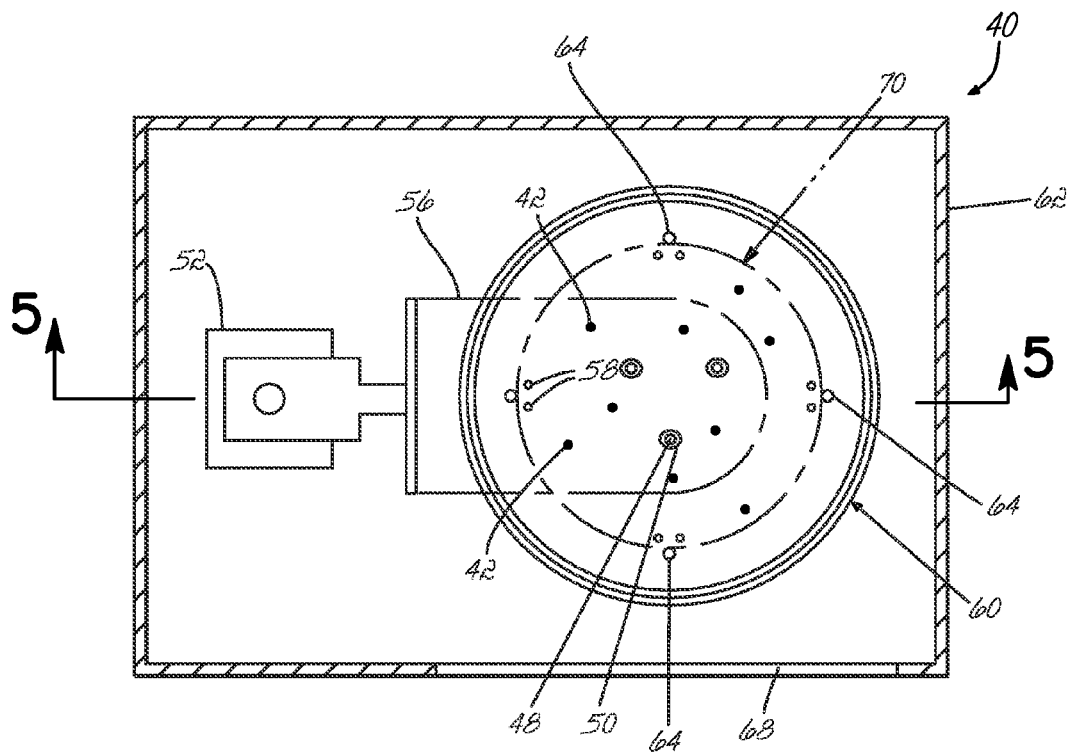
FIG. 4 is a top plan view of an inline metrology unit of the thermal processing apparatus of FIG. 2.
Figure 5:
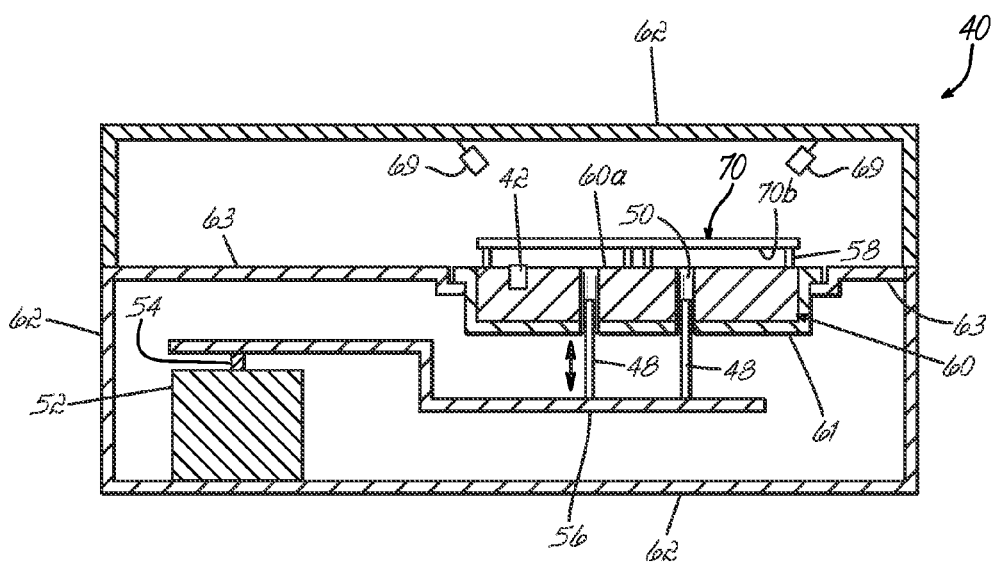
FIG. 5 is a cross-sectional view taken generally along line 5-5 in FIG. 4.
Figure 8:
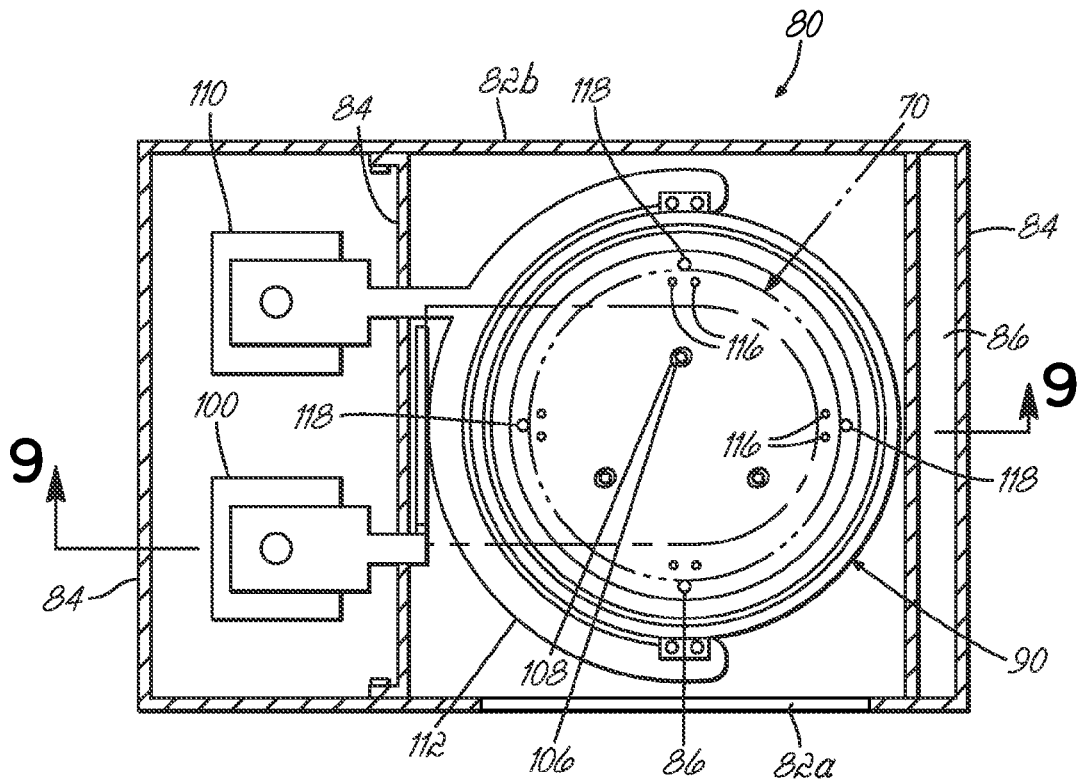
FIG. 8 is a top plan view of a baking unit of the thermal processing apparatus of FIG. 2.
Figure 9:
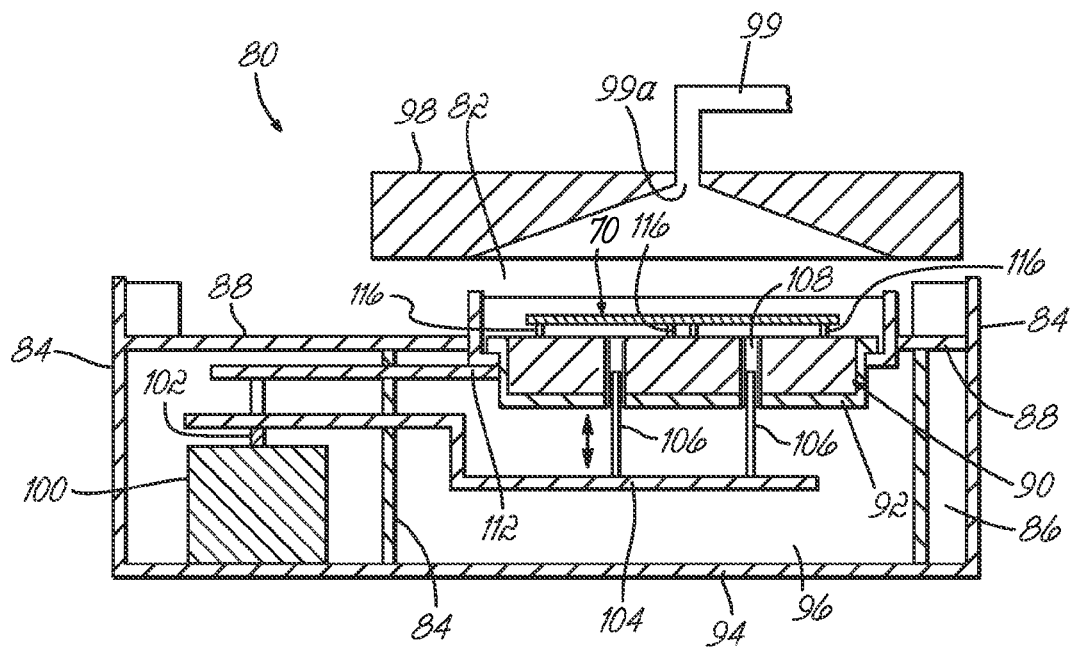
FIG. 9 is a cross-sectional view taken generally along line 9-9 in FIG. 8.
Figure 10:
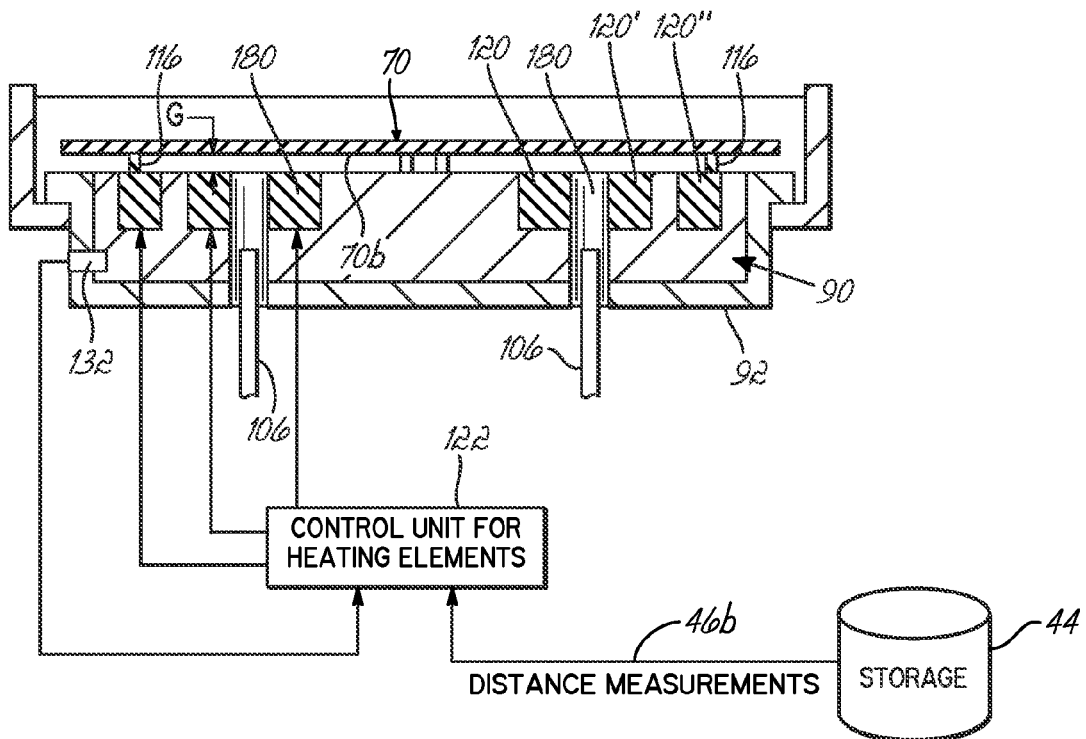
FIG. 10 is a detailed view of a portion of FIG. 8.

The base 60 includes through holes 50 that align with lift pins 48. The lift pins 48 extend from the common base and support arm 56. The common base and support arm 56 are connected to, and supported by, a rod 54 of a vertical cylinder 52. When the rod 54 is actuated to protrude from the cylinder 52, the lift pins 48 protrude from the base 60, thereby lifting the wafer 70. Likewise, when the rod 54 is retracted into the cylinder 52 the lift pins 48 recede into the through holes 50 lowering the wafer toward a top surface 60a of the base 60. Projections 64 on the top surface 60a of the base 60 accurately position the wafer 70. In addition to the projections 64 and as best show in FIGS. 3A, 3B, the wafer 70 may contain notch 70n that may be used to position the wafer in the inline metrology unit providing an orientation reference for the distance measurements. The top surface 60a also includes a plurality of smaller projections ("proximity pins") 58 adapted to support the semi-conductor wafer 70 from its bottom surface 70b so that the bottom surface 70b of a wafer 70 does not contact the top surface 60a of the base 60 of the inline metrology unit 40.

Figure 11:
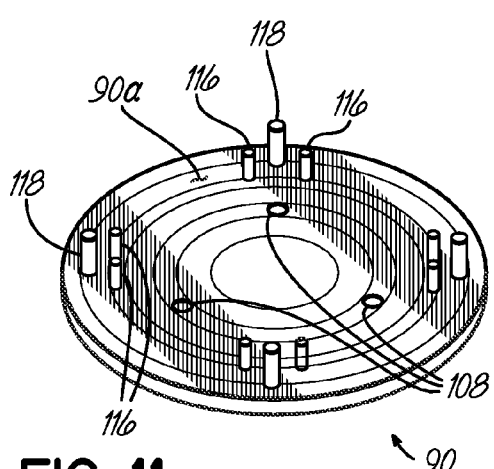
FIG. 11 is an isometric view showing detail of the base of the baking unit of FIGS. 8 and 9.
Figure 12:
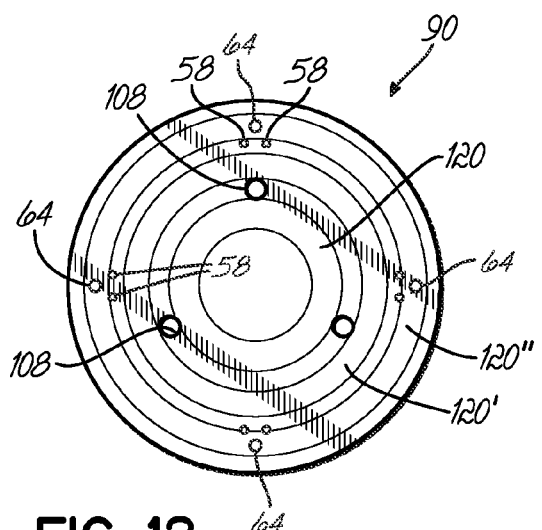
FIG. 12 is a diagrammatic top view of the base of the baking unit showing a representative arrangement for the heating elements.

The top surface 60a of the base 60 includes a plurality of proximity sensors 42. The number and location of the proximity sensors 42 may be determined by the configuration of the hotplate 90 in the baking unit 80. A sufficient number of proximity sensors 42 are utilized to provide sufficient data to control heating elements 120 in hotplate 90. Accordingly, the number of sensors 42 scales with the number of heating elements 120. In an embodiment in which the hotplate 90 has a series of concentric heating elements 120, each of the heating elements 120 may be monitored by at least 3 sensors 42 (FIG. 7) and these sensors 42 may be located at the same distance from a center point corresponding to one of the concentric heating elements 120 (FIG. 11). A variety of different types of proximity sensors 42 may be used including but not limited to infrared, acoustic, inductive, eddy current, and capacitive type proximity sensors, as well as laser interferometers.

The proximity sensors 42 are configured to determine the distances from a reference plane to the bottom surface 70b of the semiconductor wafer 70. The distance measurements obtained in the inline metrology unit 40 may be stored in control unit 122 for later use to control the hotplate 90 in the baking unit 80.

In addition to measuring the distances, in some embodiments, the IM unit 40 may also make other measurements to evaluate processing properties of the wafer 70. The IM unit 40 may provide a thickness measurement to confirm the photoresist film quality or the IM unit 40 may perform an analysis for patterned wafer defect (macro inspection). These measurements may be made simultaneously with the distance measurements using measuring device(s) 69 and are conventionally performed by making measurements on a top side of the wafer 70.

Wafer 70 may then be transferred to the other intervening modules for processing as illustrated in FIG. 1 and described above. Wafer 70 may then be transferred to a post exposure bake unit ("baking unit") 80. As discussed above, the post exposure bake activates the chemistry in the exposed regions of the photoresist. The topography data, which was measured in the inline metrology unit 40 and stored in the control unit 122, may be retrieved prior to the wafer arriving at the baking unit 80. In alternative embodiments, the topography data may be stored offline and delivered to the control unit 122 concurrently with the arrival of the wafer 70 at the baking unit 80. The topography data from the inline metrology unit 40 may be used to control the temperatures of heating elements 120 of the hotplate 90 to compensate for differences in distances of various points between the hotplate 90 and wafer 70.

With reference to FIGS. 8-11, the baking unit 80 of the thermal processing apparatus 30 heats wafers 70 to temperatures above room temperature. Each baking unit 80 may include a processing chamber 82, a hotplate 90, and at least one resistance heater forming the heating elements 120 embedded in the hotplate 90. In some embodiments, the heating elements may be arranged in a concentric ring fashion as best seen in FIG. 11.

The hotplate 90 has a plurality of through-holes 108 and a plurality of lift pins 106 inserted into the through-holes 108. The lift pins 106 are connected to and supported by an arm 104, which is further connected to and supported by a rod 102 of a vertical cylinder 100. When the rod 102 is actuated to protrude from the cylinder 100, the lift pins 106 protrude from the hotplate 90, thereby lifting the wafer 70.

The upper surface of the hotplate 90 includes projections 118, which facilitate accurate positioning of the wafer 70. In addition to the projections 118, the notch 70n (FIGS. 3A and 3B) in the wafer may be used to position the wafer such that the distance measurements obtained in the inline metrology unit 40 correspond to the heating elements 120, 120', 120" of hotplate 90. Proximity pins 116, which are located on the upper surface of the hotplate 90, support wafer 70 above hotplate 90. When the wafer 70 is delivered to the hotplate 90, the proximity pins 116 contact the bottom surface 70b of the wafer 70 and elevate the wafer 70 above the hotplate 90 forming a gap. The gap is sufficient to expose the bottom surface 70b of the wafer 70 to the elevated temperatures produced by the hotplate 90 and prevent the bottom surface 70b of the wafer 70 from contacting the hotplate 90 to prevent contamination and strain.

As discussed above, the wafers 70 carry a layer of processable material, such as photoresist. The layer contains a substance that is volatized and released at the process temperature. This volatile substance evaporates off of the wafer 70 when the layer is exposed to the heat energy produced by the hotplate 90 at temperatures sufficient to heat the wafer 70 to process temperatures. An exhaust port 98a at the center of the lid 98 communicates with an exhaust pipe 99. The waste product generated from the surface of the wafer during the heat treatment is exhausted through the exhaust port 99a and vented from the processing chamber 82 via exhaust pipe 99 to an evacuation unit (not shown).

The temperature of each heating element 120, 120', 120" of hotplate 90 (FIG. 11) is established by control unit 122. The control unit 122 utilizes the measured distances determined by proximity sensors 42 in the inline metrology unit 40 to establish set temperatures by adjusting the power for the individual heating element 120, 120', 120" to uniformly heat a wafer 70 during processing. Heating elements 120, 120', 120" selectively adjust areas on the hotplate 90 to compensate for differences in the measured distances from various points of the semi-conductor wafer 70 to the hotplate.

The temperature required for each heating element to uniformly heat the bottom surface 70b of semi-conductor wafer 70 can be determined empirically by testing the hot plate 90 using sensors located at various distances from the surface of the hot plate 90 and storing this data. Alternatively, this can be determined utilizing the following algorithm:

$$\rho C_p L \frac{dT}{dt} = \frac{k_{air}}{\delta}(T - T_{plate}) - h(T - T_{ambient})$$

where $\rho$ is the density of silicon; $C_p$ is the heat capacity of silicon; L is the thickness of the wafer; T is the temperature of the resist-coated wafer, $K_{air}$ is the thermal conductivity of air, $\delta$ is the thickness of the gap between the hot plate 90 and the wafer 70; and h is a coefficient for heat lost from the top surface of the wafer to the surroundings. Thus, the control unit 122 can either utilize stored empirical data or the algorithm in order to determine the set point for each heating element 120 on the hotplate 90.

Figure 13:
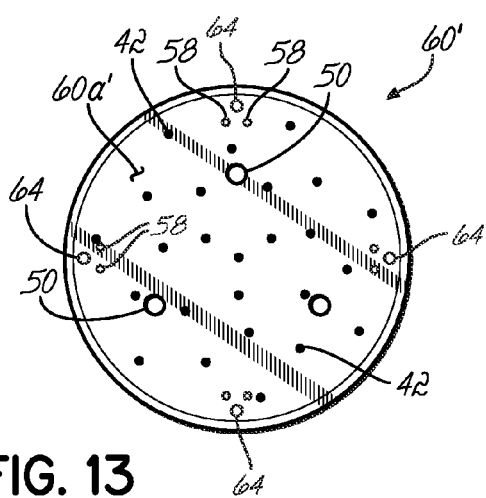
FIG. 13 is a top view of a base in an inline metrology unit having an alternative arrangement for the proximity sensors.
Figure 14:
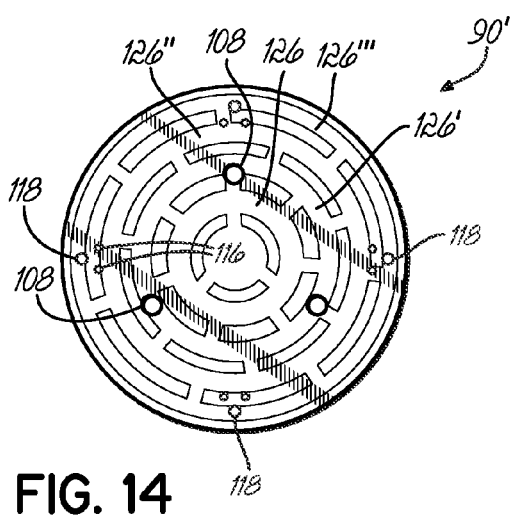
FIG. 14 is a top view of a base of a baking unit with heating elements arranged in correspondence with the proximity sensors in FIG. 13.

With reference to FIGS. 13 and 14 and in an alternative embodiment, a hotplate 90' may include a plurality of heating elements 126, 126', 126", 126'" with each one of these elements having a plurality of individual segments. The number of individual segments in each of the heating elements 126, 126', 126", 126''' may increase with increasing radius. Each of the heating element segments 126, 126', 126", 126''' may be selectively activated by the control unit 122 responsive to distances measured from the proximity sensors 42 located in the top surface 60a' of the base 60' of the inline metrology unit 40. To provide the measured distances needed to control these heating element segments 126, 126', 126", 126''', the top surface 60a' may include at least one proximity sensor 42 for each of the heating element segments 126, 126', 126, 126'''. The particular arrangement of the heating element segments 126, 126', 126", 126''' may vary depending upon the desired application.

Adjusting the heating elements 120 of the hotplate 90 allows the baking unit 80 to uniformly heat the wafer 70 compensating for irregularities or warpage of the wafer 70. Heating elements 120 may be adjusted for a wafer 70 prior to the wafer 70 arriving at the baking unit 80 so that the time required for the hotplate 90 to come to the proper temperature for each wafer 70 being processed may be minimized. Making topography measurements of the wafer 70 in the inline metrology unit 40 maintains efficiency, as the wafer 70 does not need to leave and be returned to the Track tool during processing. This invention addresses the uneven heating problem due to variability in the proximity gap with the prior art, while maintaining efficient processing of the wafer 70.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicants' general inventive concept.

What is claimed is:

1. A method for heating a wafer in a thermal processing system having an inline metrology unit and a baking unit, the wafer having a backside, the inline metrology unit having a plurality of proximity sensors, the method comprising:
   obtaining a plurality of distance measurements from the plurality of proximity sensors to the backside of the wafer;
   after obtaining the distance measurements, transferring the wafer from the inline metrology unit to the baking unit; and
   heating the wafer in the baking unit with a hotplate having a plurality of elements, each of the elements locally heating a portion of the backside of the wafer, the heat provided by each element being based on at least one of the distance measurements,
   wherein each distance measurement corresponds to a gap between the hot plate and the backside of the wafer, and
   wherein a number and location of the plurality of proximity sensors correspond to the plurality of elements of the hotplate.

2. The method of claim 1 further comprising:
   storing the distance measurements in a database; and
   associating the distance measurements in the database with the wafer.

3. The method of claim 1 wherein the distance measurements are measured in conjunction with an additional measurement of the wafer by the inline metrology unit.

4. The method of claim 3 wherein the additional measurement of the wafer is selected from the group consisting of a bare wafer thickness measurement after coating, a critical dimension measurement, and a macro inspection defect analysis.

5. The method of claim 1 wherein heating further comprises:
   supporting the wafer above a surface of the hotplate;
   transferring the plurality of distance measurements to a control unit; and
   establishing independent temperatures for each of a plurality of heating elements in the hotplate by the control unit in response to the plurality of distance measurements.

6. The method of claim 5 wherein the temperatures are established in response to the plurality of distance measurements as applied to an algorithm.

7. The method of claim 5 wherein the temperatures are established by comparing the plurality of distance measurements with empirical data stored in the control unit.

8. The method of claim 1 wherein transferring the wafer further comprises:
   delivering the wafer to the baking unit in a first unaligned position;
   orienting the wafer to a second aligned position by moving a notch on the wafer to an alignment position; and
   orienting the plurality of distance measurements to correspond to the wafer in the alignment position.

9. The method of claim 1 wherein transferring the wafer further comprises:
   delivering the wafer to the baking unit in a first known position; and
   orienting the distance measurements to correspond to the first known position.

10. A thermal processing apparatus for transferring heat to a backside of a wafer, the apparatus comprising:
    a baking unit including a base having a top surface, a support configured to support the wafer with the backside of the wafer above the top surface of the base, and a plurality of heating elements;
    an inline metrology unit upstream of the baking unit having a measuring apparatus including a plurality of proximity sensors configured to measure a distance between the backside of the wafer and the top surface of the base at each of a plurality of locations on the backside of the wafer, each distance corresponding to a gap between the top surface of the base and the backside of the wafer, the measuring device converting the distances into electrical signals; and
    a control unit electrically connected with the inline metrology unit and with the heating elements, the control unit operative for receiving the electrical signals from the inline metrology unit and individually regulating a temperature of each of the heating elements for heating the wafer in response to the distances represented by the electrical signals,
    wherein the number and locations of the plurality of proximity sensors correspond to the plurality of heating elements.

11. The apparatus of claim 10 wherein the heating elements comprise a series of concentric circles.

12. The apparatus of claim 10 wherein the heating elements comprise a series of segmented heating elements.

13. The apparatus of claim 10 wherein the measuring apparatus comprises a plurality of proximity sensors located in the top surface of the base of the inline metrology unit.

14. The apparatus of claim 13 wherein the proximity sensors are selected from the group consisting of capacitive proximity sensors, infrared proximity sensors, acoustic proximity sensors, inductive proximity sensors, eddy current proximity sensors, laser interferometers and combinations thereof.

15. The apparatus of claim 13 wherein the plurality of proximity sensors are aligned with the plurality of independently controlled heating elements.

16. The apparatus of claim 10 further comprising a data storage unit wherein the data storage unit is configured to store the distances measured and transfer the distances measured to the control unit.

17. The apparatus of claim 16 wherein the control unit comprises a processor operable to apply an algorithm to the measured distances to control the heating elements.

18. The apparatus of claim 10 further comprising:
a transfer mechanism configured to transfer the wafer from the inline metrology unit to the baking unit.

19. The apparatus of claim 18 wherein the transfer mechanism is configured to transfer the wafer to an intervening processing unit in a thermal processing system containing the thermal processing apparatus.

20. The apparatus of claim 10 wherein the inline metrology unit is further configured for an additional measurement of the wafer.

21. The apparatus of claim 20 wherein the additional measurement of the wafer is selected from the group consisting of a bare wafer thickness measurement after coating, a critical dimension measurement, and a macro inspection for defect analysis.

22. The apparatus of claim 10 wherein the control unit includes a memory to control the heating zones responsive to stored empirical data.

23. A method for heating a wafer in a thermal processing system having an inline metrology unit and a baking unit, the wafer having a backside, the inline metrology unit having a measuring apparatus with a reference plane, the method comprising:
obtaining a plurality of distance measurements from the reference plane to the backside of the wafer using the measuring apparatus of the inline metrology unit;
transferring the wafer from the inline metrology unit to the baking unit; and
applying localized heating in the baking unit to the backside of the wafer based on the plurality of distance measurements,
wherein the reference plane contains a plurality of proximity sensors configured to determine the distance measurements between the reference plane and the backside of the wafer,
wherein a number and location of the plurality of proximity sensors correspond to the configuration of elements of a hotplate applying the localized heating to the backside of the wafer, and
wherein the distances from the backside of the wafer to the reference plane are measured in conjunction with an additional measurement of the wafer by the inline metrology unit.

24. The method of claim 23 wherein the additional measurement of the wafer is selected from the group consisting of a bare wafer thickness measurement after coating, a critical dimension measurement, and a macro inspection defect analysis.

25. A thermal processing apparatus for transferring heat to a backside of a wafer, the apparatus comprising:
a baking unit including a base having a top surface, a support configured to support the wafer with the backside of the wafer above the top surface of the base, and a plurality of heating elements;
an inline metrology unit having a measuring apparatus including a plurality of proximity sensors configured to measure a distance between the backside of the wafer and the top surface of the base at each of a plurality of locations on the backside of the wafer, the measuring device converting the distances into electrical signals, and the plurality of proximity sensors being configured to make at least one additional measurement of the wafer; and
a control unit electrically connected with the inline metrology unit and with the heating elements, the control unit operative for receiving the electrical signals from the inline metrology unit and individually regulating a temperature of each of the heating elements in response to the distances represented by the electrical signals,
wherein the number and locations of the plurality of proximity sensors corresponds to the plurality of heating elements.

26. The method of claim 25 wherein the additional measurement of the wafer is selected from the group consisting of a bare wafer thickness measurement after coating, a critical dimension measurement, and a macro inspection defect analysis.

* * * * *